United States Patent
Liu et al.

(10) Patent No.: US 12,286,692 B2
(45) Date of Patent: Apr. 29, 2025

(54) ALUMINUM-SCANDIUM ALLOY TARGET WITH HIGH SCANDIUM CONTENT, AND PREPARATION METHOD THEREOF

(71) Applicant: HUNAN RARE EARTH METAL MATERIAL RESEARCH INSTITUTE CO., LTD., Hunan (CN)

(72) Inventors: Hua Liu, Hunan (CN); Meisong Huang, Hunan (CN); Yuchuan Fan, Hunan (CN); Zhijian Wang, Hunan (CN); Shuaiguang Jia, Hunan (CN); Zhen Fu, Hunan (CN); Maohai Yao, Hunan (CN); Luhui Yang, Hunan (CN)

(73) Assignee: HUNAN RARE EARTH METAL MATERIAL RESEARCH INSTITUTE CO., LTD., Hunan (CN)

( * ) Notice: Subject to any disclaimer, the term of this patent is extended or adjusted under 35 U.S.C. 154(b) by 618 days.

(21) Appl. No.: 17/633,837

(22) PCT Filed: Aug. 7, 2020

(86) PCT No.: PCT/CN2020/107596
§ 371 (c)(1),
(2) Date: Feb. 8, 2022

(87) PCT Pub. No.: WO2021/023284
PCT Pub. Date: Feb. 11, 2021

(65) Prior Publication Data
US 2022/0228240 A1    Jul. 21, 2022

(30) Foreign Application Priority Data

Aug. 8, 2019  (CN) .......................... 201910728801.2

(51) Int. Cl.
C22C 21/00 (2006.01)
C22C 28/00 (2006.01)
C23C 14/34 (2006.01)

(52) U.S. Cl.
CPC .............. *C22C 21/00* (2013.01); *C22C 28/00* (2013.01); *C23C 14/3414* (2013.01)

(58) Field of Classification Search
None
See application file for complete search history.

(56) References Cited

U.S. PATENT DOCUMENTS

| | | | |
|---|---|---|---|
| 2002/0014406 A1* | 2/2002 | Takashima | C22C 21/00 204/192.15 |
| 2006/0172454 A1 | 8/2006 | Reis et al. | |
| 2007/0137831 A1 | 6/2007 | Torng et al. | |
| 2008/0190764 A1 | 8/2008 | Torng et al. | |
| 2013/0233706 A1 | 9/2013 | Matsumoto et al. | |

FOREIGN PATENT DOCUMENTS

| | | | |
|---|---|---|---|
| AT | 510037 T | | 6/2011 |
| CN | 1818114 A | | 8/2006 |
| CN | 100557055 C | | 11/2009 |
| CN | 101831568 A | | 9/2010 |
| CN | 103154308 A | | 6/2013 |
| CN | 103952594 A | | 7/2014 |
| CN | 104480445 A | | 4/2015 |
| CN | 104711471 A | | 6/2015 |
| CN | 103154308 B | | 12/2015 |
| CN | 103952594 B | | 6/2016 |
| CN | 106086567 A | | 11/2016 |
| CN | 106244988 A | | 12/2016 |
| CN | 106591790 A | | 4/2017 |
| CN | 104711471 B | * | 5/2017 |
| CN | 107841639 A | | 3/2018 |
| CN | 106086567 B | | 5/2018 |
| CN | 108097722 A | | 6/2018 |
| CN | 108103464 A | | 6/2018 |
| CN | 108441827 A | * | 8/2018 |
| CN | 106244988 B | | 1/2019 |
| CN | 109252142 A | * | 1/2019 |

(Continued)

OTHER PUBLICATIONS

International Search Report from International Application No. PCT/CN2020/107596 mailed Oct. 30, 2020.

Page 72 of 'Mental Material & Heat Treatment (金属材料及热处理)' written by Shanghai Chemical Engineering University, etc, and published by Chemical Industry Press on Jul. 31, 1980.

Page 116 of 'Intelligent Material Technology (智能材料技术)' written by Feng, Dianying(冯典英) and published by National Defense Industry Press on Jan. 31, 2014.

(Continued)

*Primary Examiner* — George Wyszomierski
*Assistant Examiner* — Janell C Morillo
(74) *Attorney, Agent, or Firm* — Shih IP Law Group, PLLC

(57) ABSTRACT

Disclosed are an aluminum-scandium alloy target with high scandium content and a preparation method thereof. The method comprises: preparing aluminum and scandium; melting the scandium; mixing the aluminum into the scandium, smelting and cooling to obtain an aluminum-scandium alloy through a plurality of cycles; ball-milling the alloy to obtain alloy powder and drying in vacuum, then pre-pressing and sintering in vacuum to obtain an aluminum-scandium alloy target billet; performing a thermal deformation process on the target billet to obtain the target, comprising hot forging, hot rolling and finish machining. In the present disclosure, the target has more uniform structure and chemical composition, higher relative density (up to 99.0% or more), finer grain size and higher ductility; reduce defects of shrinkage cavity and porosity, save material cost, solve problem of alloys with high brittleness, unable to process targets, meeting the requirements on wiring materials for large-scale integrated circuits.

10 Claims, No Drawings

(56) References Cited

FOREIGN PATENT DOCUMENTS

| | | | |
|---|---|---|---|
| CN | 109628897 | A | 4/2019 |
| CN | 108097722 | B | 11/2019 |
| CN | 108103464 | B | 11/2019 |
| CN | 110438458 | A | 11/2019 |
| CN | 106591790 | B | 12/2019 |
| CN | 111455327 | A | 7/2020 |
| DE | 102005003445 | A1 | 8/2006 |
| DE | 102005003445 | B4 | 6/2009 |
| EP | 1683883 | A1 | 7/2006 |
| EP | 1683883 | B1 | 5/2011 |
| EP | 2626443 | A1 | 8/2013 |
| JP | H09111313 | A | 4/1997 |
| JP | 2886810 | B2 | 4/1999 |
| JP | 2006249578 | A | 9/2006 |
| JP | 2012224942 | A | 11/2012 |
| KR | 20130080047 | A | 7/2013 |
| TW | 200639261 | A | 11/2006 |
| TW | 200724698 | A | 7/2007 |
| TW | I296286 | B | 5/2008 |
| TW | 201237201 | A | 9/2012 |
| TW | I534284 | B | 5/2016 |
| WO | 2012046768 | A1 | 4/2012 |
| WO | 2021023284 | A1 | 2/2021 |

OTHER PUBLICATIONS

Page 82 of 'Material Application and Research of NI-MH Battery Materials (镍氢电池材料的应用与研究)' written by Chen, Xingying (陈兴颖), etc, and published by Jilin University Press on Nov. 30, 2016.

* cited by examiner

ND SCANDIUM ALLOY TARGET
ALUMINUM-SCANDIUM ALLOY TARGET WITH HIGH SCANDIUM CONTENT, AND PREPARATION METHOD THEREOF

This application claims the priority and benefits of Chinese Patent Application No. 201910728801.2 filed on Aug. 8, 2019, the whole contents of which are incorporated herein by reference.

TECHNICAL FIELD

The present disclosure relates to the technical field of processing and preparation of an aluminum alloy target, and in particular, to an aluminum-scandium alloy target with high scandium content and a preparation method thereof.

BACKGROUND ART

Thin film material is an important factor for the manufacture of electronic devices. Wherein, aluminum thin film has become a key material in the fields of integrated circuits, discrete devices, liquid crystal displays, etc. due to its low resistivity, easy deposition, easy etching and mature technology. With the development of electronic information technology towards high performance, multi-function, large capacity and miniaturization, the integration of semiconductor chips has become higher, and the width of integrated circuit metal interconnections has been continuously reduced. There are outstanding problems of electric migration and stress migration in the use of high-purity aluminum metal interconnection, and it has been unable to satisfy a continuous development of the miniaturization of electrode wiring. In order to solve the problems of electric migration and stress migration in the use of high-purity aluminum interconnections, the development of the aluminum targets for high-tech gradually towards alloying and diversification. The metal scandium in an aluminum alloy has functions of refining grains, inhibiting alloy recrystallization, improving corrosion resistance, etc., which can significantly improve the strength, plasticity, high temperature performance, corrosion resistance and welding performance of the alloy. Studies have found that aluminum-scandium film deposited from an aluminum-scandium alloy target can not only maintain an electrical conductivity equivalent to that of high-purity aluminum, but also can improve the corrosion resistance, especially can significantly inhibit the electric migration and stress migration. Therefore, the aluminum-scandium alloy target is considered as a wiring material for a new generation of very large-scale integrated circuits.

The methods disclosed in the prior art for preparing an aluminum-scandium alloy by aluminothermic reduction route or electrolytic route are limited to the preparation of an aluminum-scandium master alloy with low scandium content, and there are problems of impurity introduction and great limitation during the preparation process.

The prior art discloses a method for preparing an aluminum-scandium alloy by powder sintering method. As an example, Chinese Patent CN107841639A (Publication Date: Mar. 27, 2018) discloses a method for preparing an aluminum-scandium alloy target billet and its application, and specifically discloses the preparation of an aluminum-scandium alloy target billet containing 0.1~15% scandium using the powder sintering method. As another example, Chinese Patent CN108441827A (Publication Date: Aug. 24, 2018) discloses a method for preparing an aluminum-scandium alloy target, and specifically discloses the preparation of an aluminum-scandium alloy target billet containing 2~50% scandium using the powder sintering method. As a third example, Chinese Patent CN106086567 (Publication Date: Nov. 9, 2016) discloses an aluminum-scandium alloy with high scandium content and a preparation method thereof, and specifically discloses the preparation of an aluminum-scandium alloy containing 55~70% scandium using the powder sintering method, wherein, in this method, more than 99.5% of aluminum powder and more than 99.5% of scandium powder are pre-compacted at a room temperature, and sintered in a vacuum hot press to prepare a target containing 2~50% scandium. However, the above-mentioned preparation methods disclosed in the prior art require expensive metal powder as a raw material, thus has a high cost, and the aluminum powder and the scandium powder are easy to oxidize, and high oxygen content affects the purity of the product. Moreover, although an aluminum-scandium alloy with high scandium content can be prepared by powder metallurgy method, there are many pores in the powder sintered alloy, and these pores will have many adverse effects on the sputtering process of the target and the quality of the film although the material as a whole is very dense.

In the prior art, Chinese patent CN104805406A (publication date: Jul. 29, 2015) discloses an aluminum-scandium revolving target and a preparation method thereof, and specifically discloses that an under coat of the alloy is sprayed by arc spraying method, and an aluminum-scandium powder is sprayed on a stainless steel substrate including the under coat of the alloy by a controllable atmosphere cold spraying method to prepare the revolving target. The aluminum-scandium revolving target prepared by the above method has a thickness of 3~15 mm, and a compactness of 97%, which limits the application scope, that is, its application has limitations.

Therefore, it is particularly important to find a method for preparing an aluminum-scandium alloy target with high purity, low segregation, high performance, low cost and environmental protection, In particular, the higher the scandium content, the worse the processing performance of the aluminum-scandium target, thus, a method for preparing an aluminum-scandium alloy target with high scandium content has become an focus of researches.

SUMMARY

In view of the above problems, the present disclosure provides an aluminum-scandium alloy target with high scandium content and a preparation method thereof.

The present disclosure is implemented through the following technical solutions:

According to an aspect of the present disclosure, the present disclosure provides a method for preparing an aluminum-scandium alloy target with high scandium content, comprising:

preparing metal aluminum and metal scandium;

melting the metal scandium;

mixing the metal aluminum into the melted metal scandium, smelting the mixed metal aluminum and metal scandium and cooling to obtain an aluminum-scandium alloy through a plurality of cycles of mixing, smelting and cooling;

ball-milling the aluminum-scandium alloy to obtain powder of the aluminum-scandium alloy and drying the obtained powder in vacuum, then pre-pressing the dried powder and sintering the pre-pressed powder in vacuum to obtain an aluminum-scandium alloy target billet; and performing a thermal deformation process on the aluminum-scandium alloy target billet to obtain the aluminum-scandium alloy target, wherein the step of performing the thermal deformation process comprises steps of hot forging, hot rolling and finish machining.

Preferably, the aluminum-scandium alloy target billet is sequentially subjected to hot forging, hot rolling, and finish machining.

Preferably, in the step of preparing metal aluminum and metal scandium, the metal aluminum with a purity of 99.99% or more and the metal scandium with a purity of 99.9% or more are prepared, and the metal scandium accounts for a weight percentage of 35~80% and the metal aluminum accounts for a weight percentage of 20~65% of a total weight of the metal aluminum and the metal scandium.

Preferably, the process of smelting the mixed metal aluminum and metal scandium is performed in a vacuum state or under an inert gas atmosphere. More preferably, during each smelting, the temperature maintains for about 10 minutes, and cooling, and a next step of mixing the metal aluminum and smelting are performed.

Preferably, a time for the process of ball-milling is 0.5~4 hours, and after the process of drying the obtained powder in vacuum, the obtained alloy powder has a particle size less than 300 μm.

Preferably, the step of pre-pressing comprises stirring the alloy powder and a lubricant in a mixer, pre-pressing the stirred alloy powder at 35 KN for 5 minutes by using a hydraulic presser to obtain an aluminum-scandium alloy green billet; the step of vacuum sintering comprises sintering the pre-pressed aluminum-scandium alloy green billet at 800~1100° C. for 60~300 minutes in a vacuum or under an inert atmosphere to obtain the aluminum-scandium alloy target billet.

Preferably, the step of hot forging comprises maintaining the sintered aluminum-scandium alloy target billet at 550~800° C. for 30~45 minutes and then forging the aluminum-scandium alloy target billet, wherein a deformation rate is equal to or less than 30%.

Preferably, the step of hot rolling comprises: hot rolling the forged aluminum-scandium alloy target billet at 450~600° C. for a plurality of times; annealing the hot rolled aluminum-scandium alloy target billet, and leveling the aluminum-scandium alloy target billet in a heated state, wherein the deformation rate in each time is 2~12%.

Preferably, the step of finish machining comprises finish machining the leveled aluminum-scandium alloy target billet to obtain the aluminum-scandium alloy target, wherein a thickness of the aluminum-scandium alloy target is 5~20 mm.

Further, the thickness of the aluminum-scandium alloy target is 10~16 mm.

Preferably, the scandium accounts for a weight percentage of 35~80% in the aluminum-scandium alloy target.

According to another aspect of the present disclosure, the present disclosure provides an aluminum-scandium alloy target with high scandium content, which is prepared according to the above-mentioned method for preparing an aluminum-scandium alloy target with high scandium content.

Preferably, a thickness of the aluminum-scandium alloy target is 10~16 mm.

Preferably, the aluminum-scandium alloy target has a relative density of more than 99.0%.

Preferably, the scandium accounts for a weight percentage of 35~80% in the aluminum-scandium alloy target.

In the present disclosure, an aluminum-scandium alloy target is prepared by alloying smelting—powder metallurgy—thermal deformation processing, wherein, the composition uniformity of the alloy with high scandium content (the scandium content in the aluminum-scandium alloy is 35~80%) is ensured through alloying smelting, the defects such as shrinkage cavity and porosity are reduced through pre-pressing and sintering, and the defects such as shrinkage cavity and porosity are further eliminated through thermal deformation processing, so that the obtained aluminum-scandium alloy target has higher relative density (up to 99.0% or more), more uniform structure and chemical composition, finer grain size and higher ductility. The method can prepare targets with a wide range of composition and large sizes; solves the problem of alloys with high brittleness being unable to be processed into targets after melting and ingot casting, is easy for large-scale production, and can meet the requirements on large-size targets for wiring materials of the new generation of very large-scale integrated circuits; and can save the cost of material, and protect the environment.

DETAILED DESCRIPTION OF THE EMBODIMENTS

Hereinafter, the technical solution of the present disclosure will be clearly and completely described in combination with the embodiments of the present disclosure.

A preferred embodiment of the present disclosure provides a method for preparing an aluminum-scandium alloy target with high scandium content. The method includes steps of alloying smelting, powder making, pre-pressing, vacuum sintering, hot forging, hot rolling, and machining. Specifically, the method includes the following steps:

(1) Alloying smelting: metal aluminum with a purity of 99.99% or more and metal scandium with a purity of 99.9% or more are prepared. In a vacuum state and/or under a protective gas atmosphere, the metal scandium is melted, and the metal aluminum is added into the melted metal scandium and smelted and cooled to obtain an aluminum-scandium alloy through a plurality of cycles of mixing, smelting and cooling. Wherein, the metal scandium is with a weight percentage of 35~80% and the metal aluminum is with a weight percentage of 20~65%. Wherein, the metal aluminum is divided into several parts, one part of the aluminum is added in each cycle and then smelted and maintained the temperature for about 10 min, and then cooled, and a next part of the metal aluminum is added and smelted and maintained the temperature and cooled again. The scandium content in the obtained aluminum-scandium alloy is 35~80%.

(2) Powder making: the aluminum-scandium alloy is ball-milled with alcohol as a medium for 0.5~4 hours, and then is dried in vacuum to obtain an alloy powder with a particle size of less than 300 μm.

(3) Pre-pressing: the alloy powder and a lubricant are stirred in a mixer, and then a hydraulic presser is used to pre-press for maintaining a pressure at 35 KN for 5 minutes to obtain an aluminum-scandium alloy green billet.

(4) Vacuum sintering: the green billet is sintered at 800~1100° C. for 60~300 minutes in a vacuum or inert atmosphere to obtain an aluminum-scandium alloy target billet.

(5) Hot forging: the sintered target billet is forged after being maintained at 550~800° C. for 30~45 minutes, wherein the deformation rate does not exceed 30%, then it is annealed.

(6) Hot rolling: the target billet is hot rolled at 450~600° C. through a plurality of cycles, wherein the deformation in each cycle is 2~12%, and then is annealed, and the aluminum-scandium target is leveled in a heated state.

(7) Machining: the target billet is finish-machined by lathe and machining center to obtain an aluminum-scandium alloy target of required specification. The thickness of the aluminum-scandium alloy target may be 5~20 mm. The required specification may be, for example, φ185*15 mm, φ240*10 mm, φ185*15 mm, φ190*16 mm, φ180*15 mm, and other different specifications.

In the above embodiments, the metal aluminum is added into the metal scandium for smelting through a plurality of cycles, which ensures the composition uniformity of the alloy with high scandium content; the defects such as shrinkage cavity and porosity are reduced through powder making, pre-pressing and sintering, and the cost of material is reduced; the defects such as shrinkage cavity and porosity are further eliminated through thermal deformation processing processes including hot forging, hot rolling and machining, so that the obtained aluminum-scandium alloy target has higher relative density (up to 99.0% or more). The aluminum-scandium alloy target obtained by the above-mentioned embodiments has more uniform structure and chemical composition, finer grain size and higher ductility, which is beneficial to subsequent applications. In addition, the above-mentioned embodiments can prepare targets with a wide range of composition and large sizes.

First Embodiment 820 g metal aluminum with a purity of 99.99% and 455.3 g metal scandium with a purity of 99.9% are prepared. Under protective gas atmosphere, the metal scandium is melted, and the metal aluminum is added into the melted metal scandium and smelted and cooled through a plurality of cycles of mixing, smelting and cooling, to obtain an aluminum-scandium alloy with a scandium content of 35.7%. The aluminum-scandium alloy is ball-milled with alcohol as a medium for 2 hours, and then is dried in vacuum to obtain an alloy powder with a particle size of less than 300 μm. The alloy powder and a lubricant are stirred in a mixer, and are put into a mold having a diameter of 200 mm, and a hydraulic presser is then used to pre-press for maintaining a pressure at 35 KN for 5 minutes to obtain an aluminum-scandium alloy green billet. The green billet is sintered at 850° C. for 60 minutes in a vacuum atmosphere to obtain an aluminum-scandium alloy target billet. The sintered target billet is then subjected to thermal deformation processing, wherein, firstly, it is forged after being maintained at 700° C. for 45 minutes, the deformation does not exceed 30%, and after annealing, the target billet is hot rolled at 500° C. through a plurality of cycles, wherein the deformation through each cycle is 2~12%, and is annealed, and finally, the target billet is finish-machined to obtain an aluminum-scandium alloy target with φ185*15 mm, and the compactness measured by drainage method is 99.28%.

Second Embodiment 800 g metal aluminum with a purity of 99.99% and 655.2 g metal scandium with a purity of 99.9% are prepared. Under protective gas atmosphere, the metal scandium is melted, and the metal aluminum is added into the melted metal scandium and smelted and cooled through a plurality of cycles of mixing, smelting and cooling, to obtain an aluminum-scandium alloy with a scandium content of 45.4%. The aluminum-scandium alloy is ball-milled with alcohol as a medium for 2 hours, and then is dried in vacuum to obtain an alloy powder with a particle size of less than 300 μm. The alloy powder and a lubricant are stirred in a mixer, and are put into a mold having a diameter of 250 mm, and a hydraulic presser is then used to pre-press for maintaining a pressure at 35 KN for 5 minutes to obtain an aluminum-scandium alloy green billet. The green billet is sintered at 1050° C. for 120 minutes in a vacuum atmosphere to obtain an aluminum-scandium alloy target billet. The sintered target billet is then subjected to thermal deformation processing, wherein, firstly, it is forged after maintained at 750° C. for 30 minutes, the deformation does not exceed 30%, and after annealing, the target billet is hot rolled at 550° C. through a plurality of cycles, wherein the deformation through each cycle is 2~12%, and is annealed, finally, the target billet is finish-machined to obtain an aluminum-scandium alloy target with φ240*10 mm, and the compactness measured by drainage method is 99.35%.

Third Embodiment 600 g metal aluminum with a purity of 99.99% and 733.3 g metal scandium with a purity of 99.9% are prepared. Under protective gas atmosphere, the metal scandium is melted, and the metal aluminum is added into the melted metal scandium and smelted and cooled through a plurality of cycles of mixing, smelting and cooling, to obtain an aluminum-scandium alloy with a scandium content of 55%. The aluminum-scandium alloy is ball-milled with alcohol as a medium for 3 hours, and then is dried in vacuum to obtain an alloy powder with a particle size of less than 300 μm. The alloy powder and a lubricant are stirred in a mixer, and are put into a mold having a diameter of 200 mm, and a hydraulic presser is then used to pre-press for maintaining a pressure at 35 KN for 5 minutes to obtain an aluminum-scandium alloy green billet. The green billet is sintered at 800° C. for 210 minutes in a vacuum atmosphere to obtain an aluminum-scandium alloy target billet. The sintered target billet is then subjected to thermal deformation processing, wherein, firstly, it is forged after maintained at 650° C. for 30 minutes, the deformation does not exceed 30%, and after annealing, the target billet is hot rolled at 450° C. through a plurality of cycles, wherein the deformation through each cycle is 2~12%, and is annealed, finally, the target billet is finish-machined to obtain an aluminum-scandium alloy target with φ185*15 mm, and the compactness measured by drainage method is 99.45%.

Fourth Embodiment 600 g metal aluminum with a purity of 99.99% and 1000 g metal scandium with a purity of 99.9% are prepared. Under protective gas atmosphere, the metal scandium is melted, and the metal aluminum is added into the melted metal scandium and smelted and cooled through a plurality of cycles of mixing, smelting and cooling, to obtain an aluminum-scandium alloy with a scandium content of 62.5%. The aluminum-scandium alloy is ball-milled with alcohol as a medium for 3 hours, and then is dried in vacuum to obtain an alloy powder with a particle size of less than 300 μm. The alloy powder and a lubricant are stirred in a mixer, and are put into a mold having a diameter of 200 mm, and a hydraulic presser is then used to pre-press for maintaining a pressure at 35 KN for 5 minutes to obtain an aluminum-scandium alloy green billet. The green billet is sintered at 900° C. for 240 minutes in a vacuum atmosphere to obtain an aluminum-scandium alloy target billet. The sintered target billet is then subjected to thermal deformation processing, wherein, firstly, it is forged after maintained at 700° C. for 30 minutes, the deformation does not exceed 30%, and after annealing, the target billet is hot rolled at 500° C. through a plurality of cycles, wherein the deformation through each cycle is 2~12%, and is annealed, finally, the target billet is finish-machined to obtain an aluminum-scandium alloy target with φ190*16 mm, and the compactness measured by drainage method is 99.68%.

Fifth Embodiment 300 g metal aluminum with a purity of 99.99% and 998.7 g metal scandium with a purity of 99.9% are prepared. Under protective gas atmosphere, the metal scandium is melted, and the metal aluminum is added into the melted metal scandium and smelted and cooled through a plurality of cycles of mixing, smelting and cooling, to obtain an aluminum-scandium alloy with a scandium content of 76.9%. The aluminum-scandium alloy is ball-milled with alcohol as a medium for 2 hours, and then is dried in vacuum to obtain an alloy powder with a particle size of less than 300 μm. The alloy powder and a lubricant are stirred in a mixer, and are put into a mold having a diameter of 200 mm, and a hydraulic presser is then used to pre-press for maintaining a pressure at 35 KN for 5 minutes to obtain an aluminum-scandium alloy green billet. The green billet is sintered at 800° C. for 240 minutes in a vacuum atmosphere to obtain an aluminum-scandium alloy target billet. The sintered target billet is then subjected to thermal deformation processing, wherein, firstly, it is forged after maintained at 650° C. for 30 minutes, the deformation does not exceed 30%, and after annealing, the target billet is hot rolled at 450° C. through a plurality of cycles, wherein the deformation through each cycle is 2~12%, and is annealed, finally, the target billet is finish-machined to obtain an aluminum-scandium alloy target with φ180*15 mm, and the compactness measured by drainage method is 99.68%.

What is claimed is:

1. A method for preparing an aluminum-scandium alloy target with high scandium content, comprising:
preparing metal aluminum and metal scandium;
melting the metal scandium;
mixing the metal aluminum into the melted metal scandium, smelting the mixed metal aluminum and metal scandium and cooling to obtain an aluminum-scandium alloy through a plurality of cycles of mixing, smelting and cooling;
ball-milling the aluminum-scandium alloy to obtain powder of the aluminum-scandium alloy and drying the obtained powder in vacuum, then pre-pressing the dried powder and sintering the pre-pressed powder in vacuum to obtain an aluminum-scandium alloy target billet; and
performing a thermal deformation process on the aluminum-scandium alloy target billet to obtain the aluminum-scandium alloy target, wherein the step of performing the thermal deformation process comprises steps of hot forging, hot rolling and finish machining.

2. The method of claim 1, wherein, in the step of preparing metal aluminum and metal scandium, the metal aluminum with a purity of 99.99% or more and the metal scandium with a purity of 99.9% or more are prepared, and the metal scandium accounts for a weight percentage of 35~80% and the metal aluminum accounts for a weight percentage of 20~65% of a total weight of the metal aluminum and the metal scandium.

3. The method of claim 2, wherein the process of smelting the mixed metal aluminum and metal scandium is performed in a vacuum state or under an inert gas atmosphere.

4. The method of claim 1, wherein a time for the process of ball-milling is 0.5~4 hours, and after the process of drying the obtained powder in vacuum, the obtained alloy powder has a particle size less than 300 μm.

5. The method of claim 4, wherein, the step of pre-pressing the dried powder and sintering the pre-pressed powder in vacuum comprises stirring the alloy powder and a lubricant in a mixer; pre-pressing the stirred alloy powder at 35 KN for 5 minutes by using a hydraulic presser to obtain an aluminum-scandium alloy green billet; and sintering the pre-pressed aluminum-scandium alloy green billet at 800~1100° C. for 60~300 minutes in a vacuum or under an inert atmosphere.

6. The method of claim 1, wherein the step of hot forging comprises maintaining the sintered aluminum-scandium alloy target billet at 550~800° C. for 30~45 minutes and then forging the aluminum-scandium alloy target billet, wherein a deformation rate is equal to or less than 30%.

7. The method of claim 6, wherein the step of hot rolling comprises: hot rolling the forged aluminum-scandium alloy target billet at 450~600° C. for a plurality of times; annealing the hot rolled aluminum-scandium alloy target billet, and leveling the aluminum-scandium alloy target billet in a heated state, wherein the deformation rate in each time is 2~12%.

8. The method of claim 1, wherein the step of finish machining comprises finish machining the leveled aluminum-scandium alloy target billet to obtain the aluminum-scandium alloy target, wherein a thickness of the aluminum-scandium alloy target is 5~20 mm.

9. The method of claim 8, wherein the thickness of the aluminum-scandium alloy target is 10~16 mm.

10. The method of claim 1, wherein the scandium accounts for a weight percentage of 35~80% in the aluminum-scandium alloy target.

* * * * *